United States Patent
Koide

(10) Patent No.: US 6,703,253 B2
(45) Date of Patent: Mar. 9, 2004

(54) METHOD FOR PRODUCING SEMICONDUCTOR LIGHT EMITTING DEVICE AND SEMICONDUCTOR LIGHT EMITTING DEVICE PRODUCED BY SUCH METHOD

(75) Inventor: Norikatsu Koide, Nagoya (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 10/286,055

(22) Filed: Nov. 1, 2002

(65) Prior Publication Data

US 2003/0092210 A1 May 15, 2003

(30) Foreign Application Priority Data

Nov. 15, 2001 (JP) .......................... 2001-350838

(51) Int. Cl.[7] .......................... H01L 21/00; H01L 21/66; H01L 63/04; H01L 29/24; H01J 1/62
(52) U.S. Cl. .......................... 438/28; 313/506; 257/103
(58) Field of Search .......................... 438/22, 28, 34, 438/39, 42, 46; 313/483, 506; 257/88, 101–103

(56) References Cited

U.S. PATENT DOCUMENTS

2002/0153832 A1 * 10/2002 Yanagisawa et al. ....... 313/505

FOREIGN PATENT DOCUMENTS

| JP | 59-225518 | 12/1984 |
|---|---|---|
| JP | 10-135140 | 5/1998 |
| JP | 10-256151 | 9/1998 |
| JP | 10-321911 | 12/1998 |

OTHER PUBLICATIONS

Japanese Abstracted Derwent Publication JP 08250767A, "Indium gallium aluminum nitride type semiconductor LED . . . " Sep. 27, 1996.*

\* cited by examiner

*Primary Examiner*—Craig Thompson
(74) *Attorney, Agent, or Firm*—Morrison & Foerster LLP

(57) ABSTRACT

A method for producing a semiconductor light emitting device, including at least one first column-like multi-layer structure provided on a substrate and containing nitride-based semiconductor compound semiconductor layers represented by the general formula $In_xGa_yAl_zN$ (where $x+y+z=1$, $0 \leq x \leq 1$, $0 \leq y \leq 1$, $0 \leq z \leq 1$), includes a first step of forming a plurality of grooves in the substrate; and a second step of forming a plurality of first column-like multi-layer structures on the substrate so as to be separated by the grooves.

19 Claims, 12 Drawing Sheets

US 6,703,253 B2

METHOD FOR PRODUCING SEMICONDUCTOR LIGHT EMITTING DEVICE AND SEMICONDUCTOR LIGHT EMITTING DEVICE PRODUCED BY SUCH METHOD

BACKGROUND OF THE INVENTION

1. Field of the Invention

The present invention relates to a method for producing a semiconductor light emitting device, and specifically a method for producing a semiconductor light emitting device including a nitride semiconductor layer as a light emitting layer on a silicon substrate; and a semiconductor light emitting device produced by such a method.

2. Description of the Related Art

A light emitting device using a nitride semiconductor material, such as GaN, InN, AlN, or a mixed crystal thereof, usually includes a nitride semiconductor layer formed of, for example, $In_xGa_{1-x}N$ crystals, as a light emitting layer on a sapphire substrate.

Recently, silicon (Si) substrates which are less expensive and have a larger area than a sapphire substrate have been produced. A nitride semiconductor light emitting device can be produced at lower cost by using such an Si substrate instead of a sapphire substrate.

A nitride semiconductor light emitting device produced using an Si substrate has the following problem. A nitride semiconductor layer has a larger thermal expansion coefficient than that of an Si substrate. When the temperature is once raised for epitaxial growth and then is lowered to room temperature, the nitride semiconductor layer shrinks more significantly than the Si substrate, due to the difference in the thermal expansion coefficient between the Si substrate and the nitride semiconductor layer.

FIG. 13 is a schematic perspective view of a nitride semiconductor light emitting device 500 using an Si substrate 91. As shown in FIG. 13, when the temperature is raised to form a nitride semiconductor layer 92 on the Si substrate 91 by epitaxial growth and then lowered to room temperature, the nitride semiconductor layer 92 significantly shrinks. As a result, tensile stress is applied to an interface between the Si substrate 91 and the nitride semiconductor layer 92, thus possibly causing cracks 93.

In the case of a nitride semiconductor light emitting device having a double-hetero structure, when the cracks 93 are generated, an invalid leak current which does not contribute to light emission is increased in magnitude. This prevents output of high luminance emission. In order to produce a nitride semiconductor device having a long life and high luminance emission, it is indispensable to prevent the generation of such cracks 93.

FIG. 14 is a schematic cross-sectional view illustrating a production step of another conventional nitride semiconductor light emitting device 600.

The nitride semiconductor light emitting device 600 is produced as follows. A mask layer 41B having a plurality of openings (windows) 42B is formed on an Si substrate 91A using an oxide layer or the like, and then a nitride semiconductor layer 92A is formed in each of the openings 42B of the mask layer 41B by epitaxial growth. Owing to such a step, a tensile stress applied to an interface between the Si substrate 91A and the nitride semiconductor layer 92A is alleviated, thus preventing the generation of cracks.

This conventional method has the following problem. Depending on the size of the mask layer 41B, the width and material of the mask layer 41B, and the growth temperature and rate, the material used for the epitaxial growth remains on the mask layer 41B. This raises the concentration of the material in a peripheral portion of the nitride semiconductor layer 92A in the opening 42B, which is in the vicinity of the mask layer 41B, is excessively high. As a result, as shown in FIG. 14, the peripheral portion of the nitride semiconductor layer 92A in the opening 42B is about three times as thick as a central portion thereof, due to growth referred to as "edge growth".

As described above, the method of forming the nitride semiconductor layer 92A by epitaxial growth in the opening 42B prevents the central portion thereof from being cracked, but has a risk of causing cracks in the peripheral portion of the nitride semiconductor layer 92A due to the local distortion applied to the thick portion.

When a substrate formed of a material having a smaller thermal expansion coefficient than a nitride semiconductor material, such as Si, it is difficult to produce a nitride semiconductor light emitting device having a long life and high luminance emission, with prevention of crack generation. It is not sufficient to form a nitride semiconductor layer in an opening by epitaxial growth.

SUMMARY OF THE INVENTION

According to one aspect of the invention, a method for producing a semiconductor light emitting device including at least one first column-like multi-layer structure provided on a substrate and containing nitride-based semiconductor compound semiconductor layers represented by the general formula $In_xGa_yAl_zN$ (where $x+y+z=1$, $0 \leq x \leq 1$, $0 \leq y \leq 1$, $0 \leq z \leq 1$) is provided. The method includes a first step of forming a plurality of grooves in the substrate; and a second step of forming a plurality of first column-like multi-layer structures on the substrate so as to be separated by the grooves.

In one embodiment of the invention, the method further includes a third step of, after the second step, removing a substance including epitaxial layers deposited in the grooves; and a fourth step of, after the third step, forming an insulating layer in the grooves for electrically separating the plurality of first column-like multi-layer structures from each other.

In one embodiment of the invention, the method further includes the step of, after the fourth step, forming a transparent electrode for electrically connecting the plurality of first column-like multi-layer structures to each other.

In one embodiment of the invention, the method further includes the steps of, after the fourth step, forming a transparent electrode for each of the plurality of first connecting the column-like multi-layer structures; and dividing the resultant laminate into a plurality of chips such that each chip includes one first column-like multi-layer structure.

In one embodiment of the invention, the grooves are arranged in a lattice pattern. The substrate includes a plurality of first areas and a plurality of second areas, each of which is surrounded by the grooves. The plurality of first areas and the plurality of second areas are arranged in a chess board pattern. The method further comprises the steps of, before the first step, forming a mask layer so as to cover the substrate, and removing a portion of the mask layer corresponding to the grooves which are to be formed in the substrate. The second step includes the steps of removing portions of the mask layer which are on the plurality of first areas and forming one first column-like multi-layer structure on each of the plurality of first areas, and removing portions of the mask layer which are on the plurality of second areas and forming a second column-like multi-layer structure on each of the plurality of second areas.

In one embodiment of the invention, the plurality of first column-like multi-layer structures each have a thermal expansion coefficient which is larger than a thermal expansion coefficient of the substrate.

In one embodiment of the invention, the substrate is formed of silicon.

In one embodiment of the invention, the grooves each have a depth which is at least 50% of a thickness of each of the plurality of first column-like multi-layer structures in a direction vertical to a surface of the substrate, and is 10 $\mu$m or less. The grooves each have a width which is 2 $\mu$m or more and 10 $\mu$m or less.

In one embodiment of the invention, grooves cross each other.

According to another aspect of the invention, a semiconductor light emitting device produced by the above-described method is provided.

Thus, the invention described herein makes possible the advantages of providing a method for producing a semiconductor light emitting device using an Si substrate and still preventing cracks from being generated at an interface between the Si substrate and a nitride semiconductor layer; and a semiconductor light emitting device produced by such a method.

These and other advantages of the present invention will become apparent to those skilled in the art upon reading and understanding the following detailed description with reference to the accompanying figures.

DESCRIPTION OF THE PREFERRED EMBODIMENTS

Hereinafter, the present invention will be described by way of illustrative examples with reference to the accompanying drawings. In this specification, the term "column-like multi-layer structure" refers to a laminate including nitride semiconductor layers which is formed on a part of an Si substrate by epitaxial growth. The term "semiconductor light emitting device" refers to a light emitting device including at least one column-like multi-layer structure on the Si substrate.

EXAMPLE 1

Figure 1:
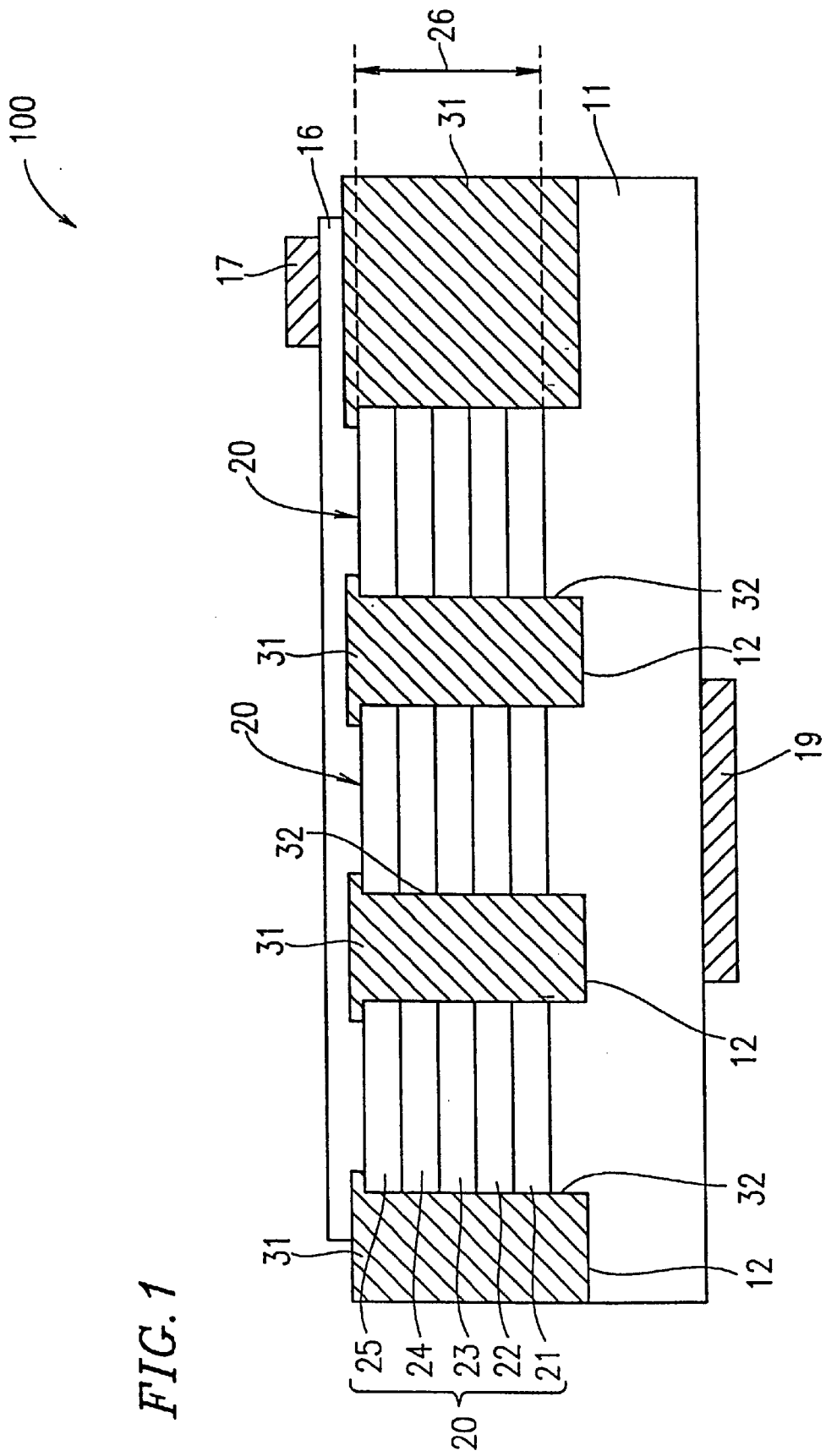
FIG. 1 is a schematic cross-sectional view of a semiconductor light emitting device according to a first example of the present invention.
Figure 2:
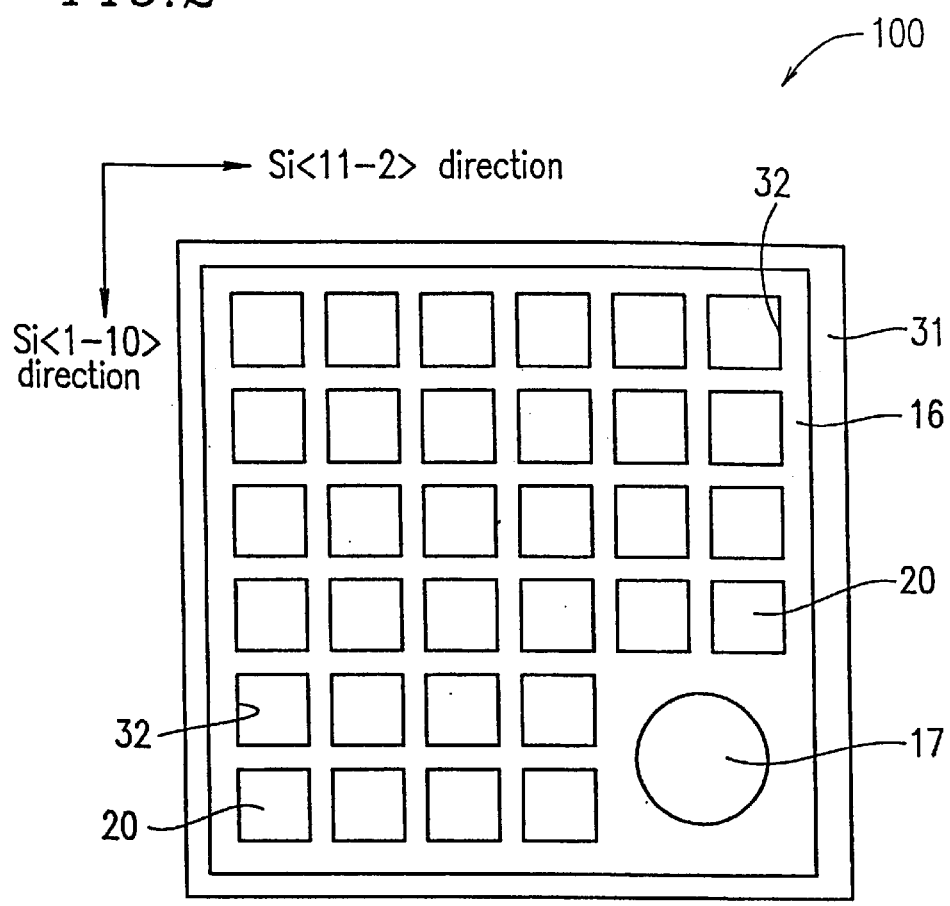
FIG. 2 is a schematic plan view of the semiconductor light emitting device shown in FIG. 1.

FIG. 1 is a schematic cross-sectional view of a nitride semiconductor light emitting device 100 according to a first example of the present invention. FIG. 2 is a schematic plan view of the nitride semiconductor light emitting device 100.

The nitride semiconductor light emitting device 100 includes an Si substrate 11 having a (111) plane and an insulating layer 31 provided on the Si substrate 11. The insulating layer 31 has a plurality of openings 32 through which a nitride semiconductor layer is to be grown. The insulating layer 31 contains, for example, $SiO_2$. In each of the openings 32, a column-like multi-layer structure 20 is provided. The column-like multi-layer structure 20 includes gallium nitride-based compound semiconductor layers represented by the general formula $In_xGa_yAl_zN$ (where x+y+z=1, $0 \leq x \leq 1$, $0 \leq y \leq 1$, $0 \leq z \leq 1$).

The insulating layer 31 is precisely provided on a bottom surface of a plurality of grooves 12 formed in a surface of the Si substrate 11. The grooves 12 are provided in the entire surface of the Si substrate 11 except in a position of at least one of the four corners thereof. The grooves 12 are arranged in a lattice pattern so as to cross each other perpendicularly. The openings 32 are each surrounded by the grooves 12, and are provided except in a position of at least one of the four corners thereof (see FIG. 2). The openings 32 pass through the insulating layer 31 so as to expose the surface of the Si substrate 11. The openings 32 are square, and are provided in a matrix in an Si <11-2 > direction and an Si <1-10 > direction in which the nitride semiconductor material is crystal-grown in the openings 32. The <11-2 > direction and the <1-10 > direction are perpendicular to each other.

The column-like multi-layer structure 20 includes a buffer layer 21 provided on the surface of the Si substrate 11. The buffer layer 21 contains Si-doped n-AlInN. The column-like multi-layer structure 20 further includes a first clad layer 22 containing n-GaInN, a light emitting layer 23 containing $In_xGa_{1-x}N$, a carrier block layer 24 containing p-AlGaInN, and a second clad layer 25 containing p-GaInN. The layers 22, 23, 24 and 25 are stacked on the buffer layer 21 in this order. The column-like multi-layer structure 20 has a designed thickness 26. The designed thickness 26 is a thickness in a direction perpendicular to the planar direction of the Si substrate 11.

The column-like multi-layer structure 20 is buried in the insulating layer 31. Atop surface of the insulating layer 31 is substantially entirely covered with a transparent electrode 16, such that a top surface of each of the column-like multi-layer structure 20, i.e., the second clad layer 25, contacts the transparent electrode 16. In this manner, all the column-like multi-layer structures 20 are electrically connected to each other.

On a corner of the transparent electrode 16, a cylindrical bonding electrode 17 is provided for externally supplying electric current to the transparent electrode 16. On a bottom surface of the Si substrate 11, a rear electrode 19 is provided.

The light emitting layer 23 can provide various wavelengths of band-to-band emission from an ultraviolet light range to a red light range by changing the ratio x of $In_xGa_{1-x}N$. In this example, the ratio x of In is set such that the light emitting layer 23 of all the column-like multi-layer structures 20 emits blue light.

The transparent electrode 16 connected to the second clad layer 25 contains a metal layer or an ITO layer having a thickness of 20 nm or less. The ITO layer preferably contains at least one metals of Ta, Co, Rh, Ni, Pd, Pt, Cu, Ag and Au.

The rear electrode 19 contains a metal, preferably at least one of Al, Ti, Zr, Hf, V and Nb.

The nitride semiconductor light emitting device 100 having the above-described structure is produced in the following manner.

Figure 3:
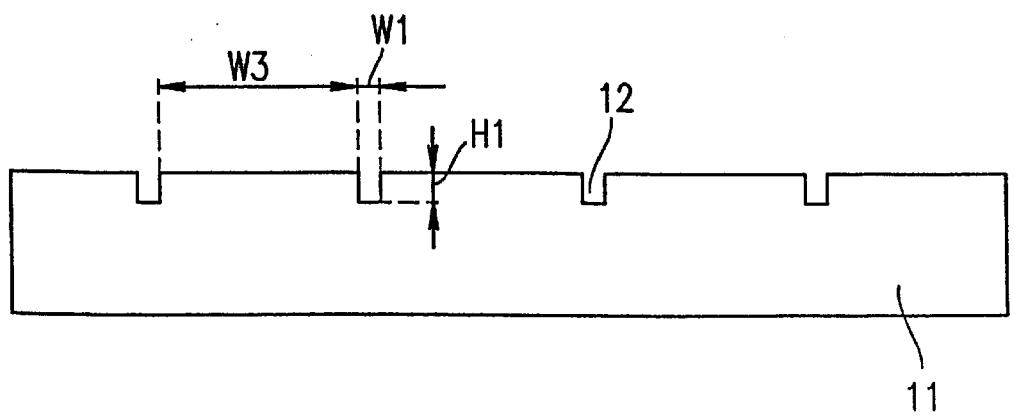
FIG. 3 is a schematic cross-sectional view of an Si substrate with grooves obtained during the production of the semiconductor light emitting device shown in FIG. 1.

FIG. 3 is a schematic cross-sectional view of the Si substrate 11 having the grooves 12. After the Si substrate 11 is washed, the grooves 12 are formed in a prescribed lattice pattern so as not to interfere the positions corresponding to the plurality of openings 32 in which the column-like multi-layer structures 20 are to be grown. The grooves 12 each have a width W1 of about 5 μm and a depth H1 of about 5 μm. Each opening 32 has a width W3 of about 100 μm.

The width W3 of the opening 32 is preferably in the range of 50 μm to 150 μm. When the width W3 of the opening 32 exceeds 200 μm, the generation of cracks is likely to occur due to the thermal distortion caused by the difference in the thermal expansion coefficient between the Si substrate 11 and the column-like multi-layer structures 20.

The grooves 12 may be formed by reactive ion etching (RIE) or by etching Si using an acid represented by a mixed acid containing HF, $HNO_3$ and acetic acid.

The width W1 of each of grooves 12 is preferably in the range of 2 μm to 10 μm. When the width W1 is less than 2 μm, the selectability in growth of nitride semiconductor materials is lowered and thus two adjacent column-like multi-layer structures 20 are combined together, which results in a high possibility of crack generation. The depth H1 of each of the grooves 12 is preferably greater than the width W1, since in this case, two adjacent column-like multi-layer structures 20 are not combined together and thus cracks are not generated.

The depth H1 is preferably 50% or more of the designed thickness 26 (FIG. 1) of the column-like multi-layer structures 20. When the depth H1 is less than 50% of the designed thickness 26, the following problem occurs. While the column-like multi-layer structure 20 is grown in a later production step in each opening 32, the semiconductor material comes out of the opening 32 and drops into the grooves 12. This semiconductor material is combined with the semiconductor material forming the column-like multi-layer structure 20, and thus the possibility that the cracks are generated is increased. The depth H1 is also preferably 10 μm or less. When the depth H1 is more than 10 μm, the semiconductor material used for forming the column-like multi-layer structure 20 is deposited on a side wall of each groove 12 in a polycrystalline state. Thus, the current leaks from the nitride semiconductor light emitting device 100, which deteriorates the characteristics of the nitride semiconductor light emitting device 100 and thus lowers the light emission efficiency thereof. The semiconductor material can be prevented from being deposited on the side wall of each groove 12 by forming a mask of an oxide layer or the like on the side wall of each groove 12.

The grooves 12 are provided in order to separate the nitride semiconductor layers grown in two adjacent openings 32. Therefore, the grooves 12 may be two-stepped or multi-stepped. The grooves 12 may be formed so as to have a V-shaped cross-section using, for example, scribing or anisotropic etching.

After the grooves 12 are formed in the Si substrate 11 as described above, the surface of the Si substrate 11 is washed. Then, the Si substrate 11 having the grooves 12 is put into an MOCVD apparatus. The Si substrate 11 is washed at a temperature of as high as 1100° C. in a hydrogen ($H_2$) atmosphere.

Figure 4:
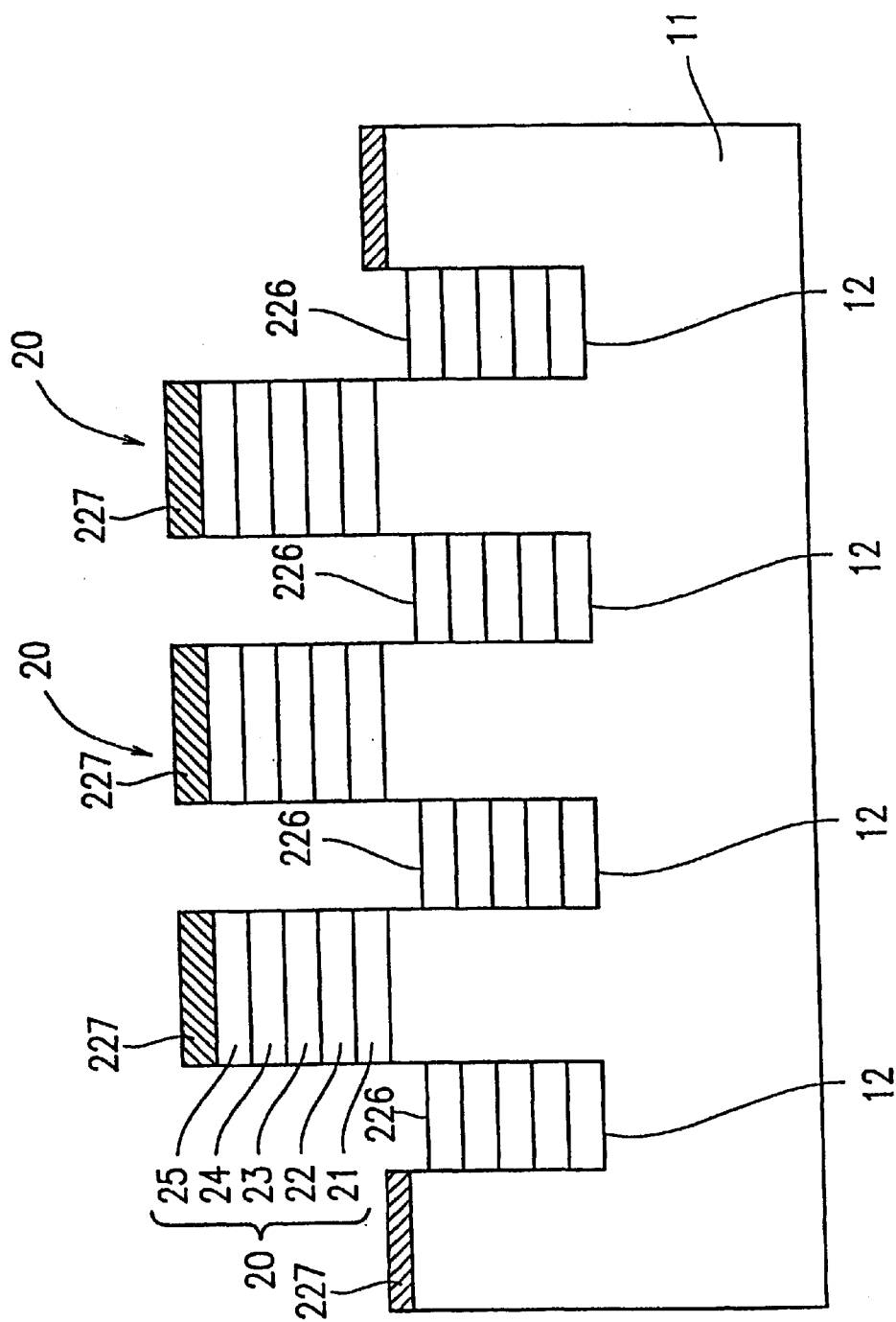
FIG. 4 is a schematic cross-sectional view of a laminate obtained during the production of the semiconductor light emitting device shown in FIG. 1.

FIG. 4 is a schematic cross-sectional view of a step of production of the nitride light emitting device 100. The column-like multi-layer structures 20 shown in FIG. 4 are grown as follows.

While supplying $N_2$ as a carrier gas at a flow rate of 10 L/min. to the MOCVD apparatus, $NH_3$, trimethyl aluminum (TMA) and trimethyl indium (TMI) are supplied at 800° C., at respective flow rates of 5 L/min., 20 μmol/min., and 137 μmol/min. Several seconds later, $SiH_4$ gas is introduced to the MOCVD apparatus, thereby performing Si doping. Thus, the buffer layer 21 of $Al_{0.85}In_{0.15}N$ is grown to a thickness of 30 nm in each of positions corresponding to the openings 32.

In the above-described crystal growth of MOVPE, organic metals (TMA and TMI) as a group III gas are supplied several seconds before $NH_3$ gas of group V. This flattens the buffer layer 21, for the following possible reason. In the case where $NH_3$ gas is supplied before the organic metals, the surface of the Si substrate 11 is nitrided. By contrast, when the organic metals are supplied before $NH_3$ gas, the surface of the Si substrate 11 is prevented from being nitrided, and a group III element is provided on the surface of the Si substrate 11. The precise timing for supplying the organic metals before the $NH_3$ gas varies depending on the specifications of the MOCVD apparatus.

Before providing the buffer layer 21, it is preferable to provide a layer of $Al_{0.95}In_{0.05}N$, which has a higher Al ratio than the buffer layer 21 on the Si substrate 11, to a thickness of 20 nm. With such a structure, the state of the interface between the Si substrate 11 and the column-like multi-layer structure 20 is improved.

After the buffer layer 21 is formed, the supply of TMA is stopped. TMG is introduced at a flow rate of about 20 μmol/min., and TMI is introduced at a flow rate of about 100 μmol/min., still at 800° C., thereby crystal-growing Si-doped $Ga_{0.92}In_{0.08}N$ so as to form the first clad layer 22 of n-type having a thickness of about 300 nm.

The first clad layer 22 may be formed of GaN, which is obtained by increasing the temperature after the buffer layer 21 is formed. The first clad layer 22 may also be formed of GaInN, which includes In and excludes Al. The GaInN layer can be grown at a lower temperature, which contributes to the suppression of crack generation in the Si substrate 11.

After the first clad layer 22 is formed, the supply of TMA, TMI, and TMG is stopped, and the substrate temperature is lowered to 760° C. Then, TMI and TMG are supplied at respective flow rates of 6.5 μmol/min. and 2.8 μmol./min, thereby growing a well layer containing $In_{0.18}Ga_{0.82}N$ to a thickness of 3 nm. Then, the temperature is raised to 850° C., and TMG is supplied at a flow rate of 14 μmol/min., thereby growing a barrier layer containing GaN. The growth of the well layer and the barrier layer is repeated in this manner, thereby forming a multiple quantum well (MQW) layer including five well layers and five barrier layers provided alternately. The multiple quantum well (MQW) layer acts as the light emitting layer 23.

After the light emitting layer 23 is formed, TMG, TMA, and TMI are supplied at respective flow rates of 11 μmol/min., 1.1 μmol/min. and 40 μmol/min. at substantially the same temperature as used for growing the uppermost barrier layer. Concurrently, biscyclopentadienyl magnesium ($Cp_2Mg$), which is a p-type doping gas, is supplied at a flow rate of 10 nmol/min. Thus, the carrier block layer 24 of p-type containing Mg-doped $Al_{0.20}Ga_{0.75}In_{0.05}N$ is grown to a thickness of 50 nm.

After the carrier block layer 24 is formed, the supply of TMA is stopped. Thus, Mg-doped GaN is crystal-grown at substantially the same temperature, thereby forming the second clad layer 25 of p-type $Ga_{0.9}In_{0.1}N$ to a thickness of 100 nm.

In this manner, the column-like multi-layer structure 20 is formed on the Si substrate 11. Then, the supply of TMG, TMI and $Cp_2Mg$ is stopped and the temperature is lowered to room temperature. Then, the resultant laminate is removed from the MOCVD apparatus. Thus, the column-like multi-layer structures 20 are epitaxially grown on the Si substrate 11 as shown in FIG. 4.

In this example, as described above, the grooves 12 are formed in the Si substrate 11. Owing to the grooves 12, layers of the column-like multi-layer structure 20 grow with a uniform thickness in the direction parallel to the surface of the Si substrate 11, with no edge growth. Therefore, the generation of cracks is suppressed.

Figure 5:
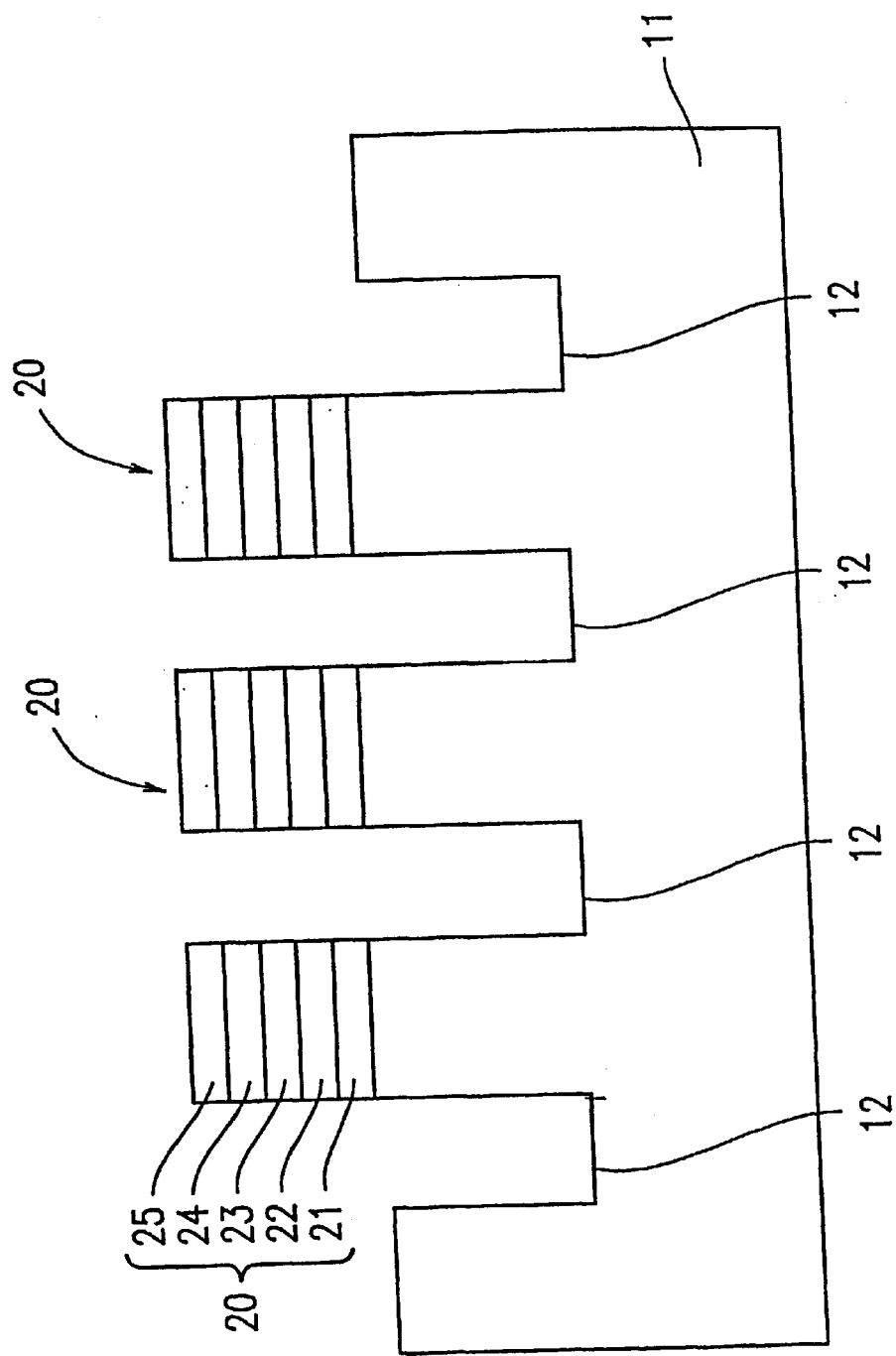
FIG. 5 is a schematic cross-sectional view of another laminate obtained during the production of the semiconductor light emitting device shown in FIG. 1.

At this point, the semiconductor material which came out of the openings 32 during the formation of the column-like multi-layer structures 20 is also in the grooves 12 as a substance 226 including epitaxial layers which are unintentionally deposited. The substance 226 is removed as follows. A silicon oxide layer is formed on the resultant laminate by sputtering or CVD and then etched by photolithography, thereby forming a mask layer 227 which exposes the substance 226. Using the mask layer 227, the substance 226 in the grooves 12 is removed by RIE. Then, the mask layer 227 is also removed, as shown in FIG. 5.

Then, as shown in FIG. 1, the insulating layer 31 is formed in the grooves 12. The insulating layer 31 is formed such that the column-like multi-layer structures 20 are not shortcircuited when the transparent electrode 16 is provided in a later production step.

On an entire surface of the insulating layer 31, the transparent electrode 16 is formed so as to cover the second clad layer 25 (p-type $Ga_{0.9}In_{0.1}N$) of all the column-like multi-layer structures 20. By this step, the column-like multi-layer structures 20, which are insulated from each other by the insulating layer 31, are electrically connected to each other by the transparent electrode 16.

Then, the bonding electrodes 17 are formed on a corner of the transparent electrode 16 where no column-like multi-layer structure is provided. The rear electrode 19 is formed on a bottom surface of the Si substrate 11. Thus, the nitride semiconductor light emitting device 100 shown in FIGS. 1 and 2 is produced.

In the nitride semiconductor light emitting device 100 according to the first example, the column-like multi-layer structures 20 are insulated from each other by the insulating layer 31 provided in the grooves 12 formed in the Si substrate 11 for the purpose of suppressing the generation of cracks. Therefore, the transparent electrode 16 for connecting all the column-like multi-layer structures 20 needs to be provided. One bonding electrode 17 is provided for the transparent electrode 16 in each chip.

The nitride semiconductor light emitting device 100 operates as follows. A voltage is externally applied to the transparent electrode 16 via the bonding electrode 17, and thus the voltage is applied to each of the column-like multi-layer structures 20 which are insulated from each other by the insulating layer 31. By the voltage difference between each column-like multi-layer structure 20 and the rear electrode 19 on the bottom surface of the Si substrate 11, light is emitted from the light emitting layer 23 of each column-like multi-layer structure 20. The light emitted from the light emitting layer 23 is directed upward from the top surface of each column-like multi-layer structure 20 through the transparent electrode 16.

As described above, in the first example, the grooves 12 are formed in the Si substrate 11 so as to separate the column-like multi-layer structures 20 from one another. Therefore, layers of the column-like multi-layer structures 20 are epitaxially grown in a uniform thickness in the entirety of the openings 32 in a direction parallel to the surface of the Si substrate 11, without edge growth. Thus, the generation of cracks is suppressed. As a result, the nitride semiconductor light emitting device 100 provides a long life and high luminance emission despite the use of the Si substrate 11.

Figure 6:
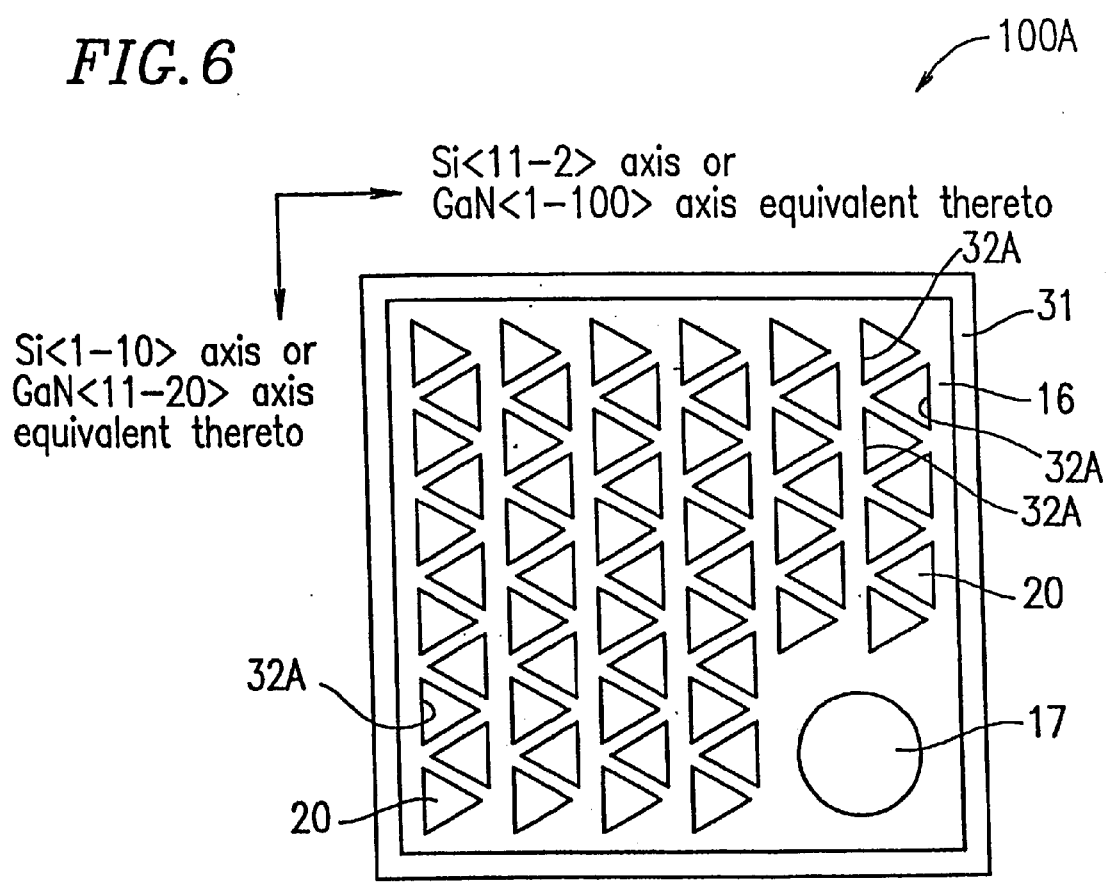
FIG. 6 is a schematic plan view of another semiconductor light emitting device according to the first example of the present invention.

FIG. 6 is a schematic plan view of another nitride semiconductor light emitting device 100A according to the first example of the present invention.

In the nitride semiconductor light emitting device 100A, grooves are formed in the Si substrate 11, such that the insulating layer 31 provided on the Si substrate 11 has a plurality of equilateral triangular openings 32A. As described above, the crystal growth directions of the nitride semiconductor materials provided on the Si substrate 11 are the Si <11-2> direction and the Si <1-10> direction which are perpendicular to each other. The openings 32A may be aligned such that one side of the triangles is on a straight line along the <1-10> direction. The apex of the triangle is in the <11-2> direction from the center of the one side. Every two adjacent triangles aligned in this manner interpose another triangle having one side aligned on a straight line in the <1-10> direction. The apex of the another triangle is in the opposite direction to the <11-2> direction from the center of the one side.

The nitride semiconductor light emitting device 100A includes a column-like multi-layer structure 20 in each of the triangular openings 32A, and the transparent electrode 16, the bonding electrode 17 and the rear electrode 19.

In the case where the column-like multi-layer structure 20 is formed of a hexagonal-system gallium nitride-based compound semiconductor material, the generation of cracks is likely to occur in a direction parallel to the <11-20> axis of the GaN layer. In order to avoid the generation of cracks, the grooves are formed such that the <11-20> axis of the GaN layer is parallel to one side of the triangular openings 32A. In the case where the Si substrate 11 has a (111) plane, the grooves are formed such that the <11-20> axis of the GaN layer is parallel to the Si <1-10> axis of the Si substrate 11.

EXAMPLE 2

Figure 7:
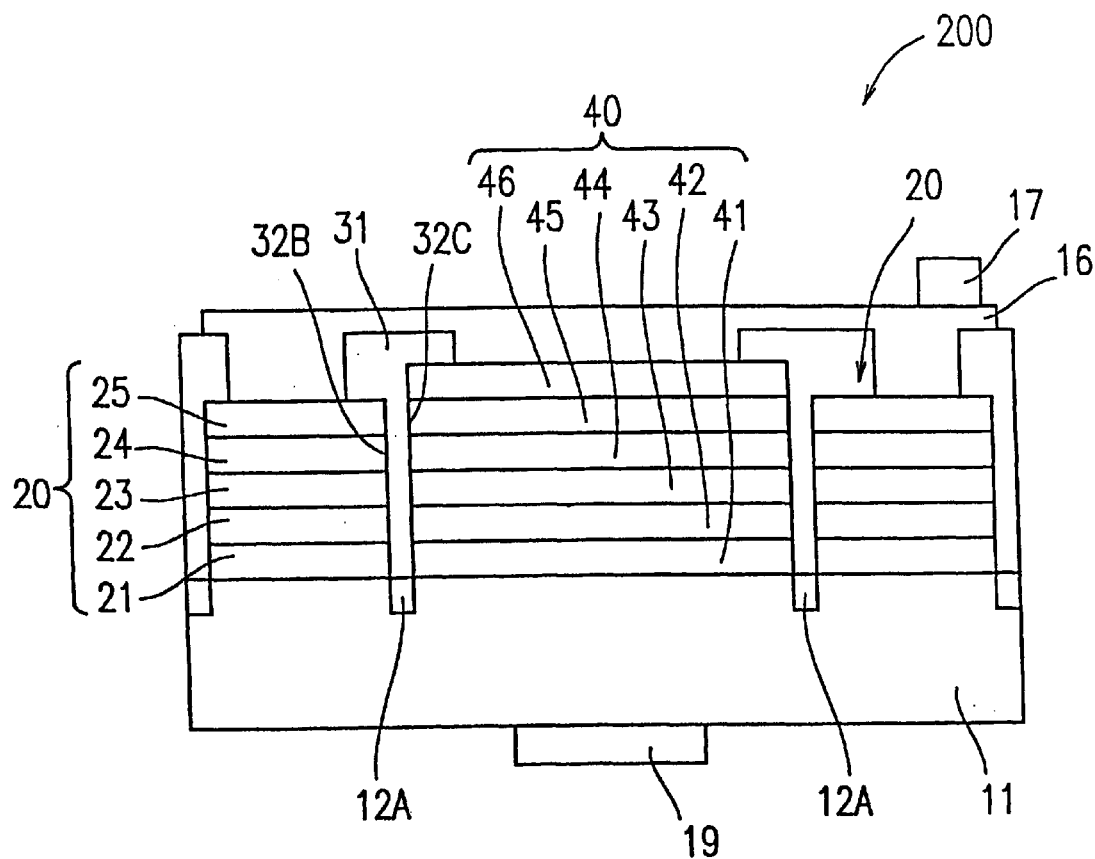
FIG. 7 is a schematic cross-sectional view of a semiconductor light emitting device according to a second example of the present invention.
Figure 8:
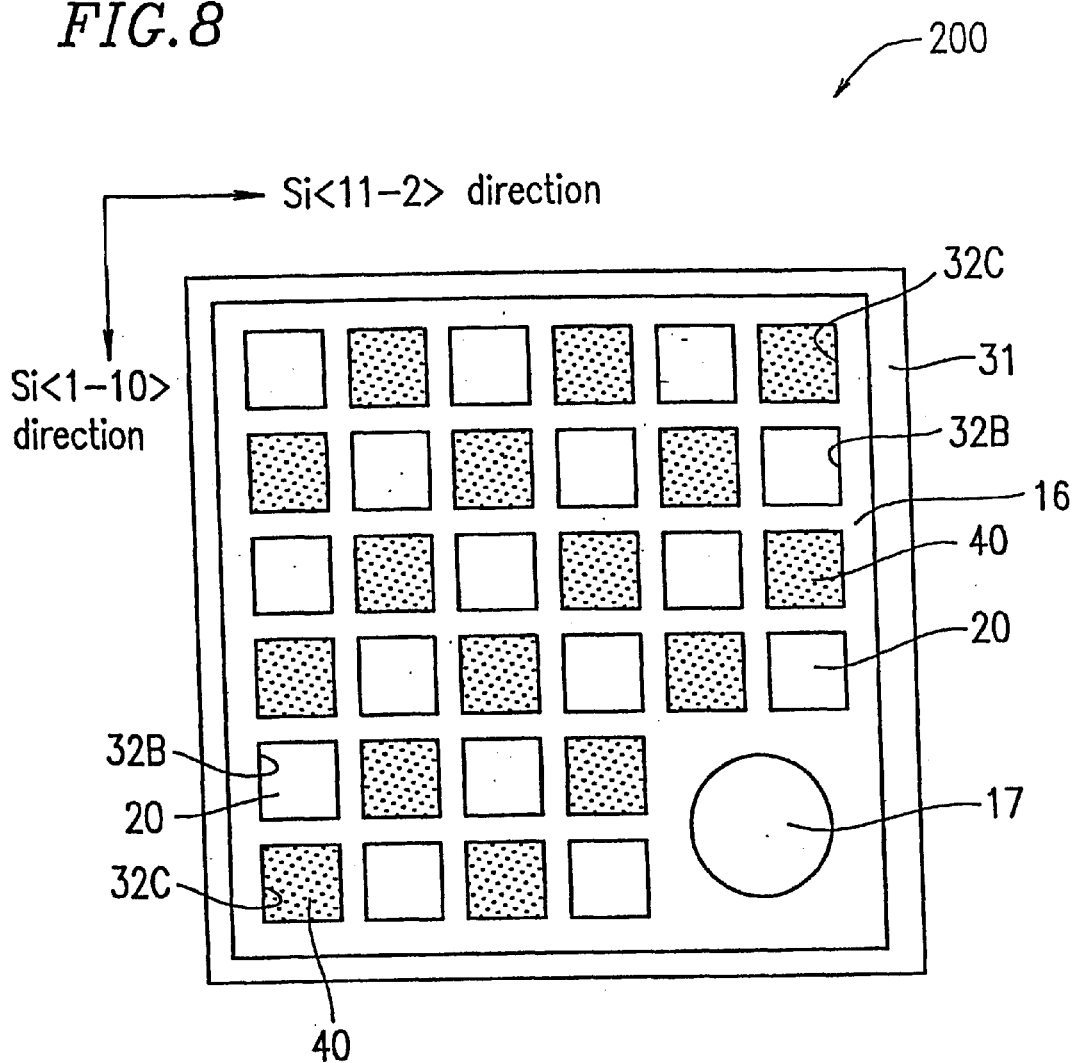
FIG. 8 is a schematic plan view of the semiconductor light emitting device shown in FIG. 7.

FIG. 7 is a schematic cross-sectional view of a nitride semiconductor light emitting device 200 according to a second example of the present invention. FIG. 8 is a schematic plan view of the nitride semiconductor light emitting device 200. Identical elements previously discussed with respect to FIGS. 1 through 6 in the first example bear identical reference numerals and the detailed descriptions thereof will be omitted.

The nitride semiconductor light emitting device 200 includes an Si substrate 11 having a (111) plane and an insulating layer 31 provided on the Si substrate 11. The insulating layer 31 has two types of openings 32B and 32C. In each opening 32B, a column-like multi-layer structure 20 is provided. In each opening 32C, a column-like multi-layer structure 40 is provided. The insulating layer 31 contains, for example, $SiO_2$.

The insulating layer 31 is precisely provided on a bottom surface of a plurality of grooves 12A formed in a surface of the Si substrate 11. The grooves 12A are provided in the entire surface of the Si substrate 11 except in a position of at least one of the four corners thereof (see FIG. 8). The grooves 12A are provided in a lattice pattern so as to cross each other perpendicularly. The openings 32B and 32C are each surrounded by the grooves 12A, and are provided except in a position of at least one of the four corners thereof. The openings 32B and 32C pass through the insulating layer 31 so as to expose the surface of the Si substrate 11. The openings 32B and 32C are square, and are provided in a matrix in an Si<11-2> direction and an Si<1-10> direction in which the nitride semiconductor material is crystal-grown in the openings 32B and 32C. The <11-2> direction and the <1-10> direction are perpendicular to each other. The openings 32B and 32C are arranged alternately both in the <11-2> direction and the <1-10> direction. The openings 32B and 32C are both arranged in a chess board pattern.

The column-like multi-layer structure 20 provided in each opening 32B includes a buffer layer 21 provided on the surface of the Si substrate 11. The buffer layer 21 contains Si-doped n-AlInN. The column-like multi-layer structure 20 further includes a first clad layer 22 containing n-GaInN, a light emitting layer 23 containing $In_xGa_{1-x}N$, a carrier block layer 24 containing p-AlGaInN, and a second clad layer 25 containing p-GaInN. The layers 22, 23, 24 and 25 are stacked on the buffer layer 21 in this order.

The column-like multi-layer structure 40 provided in each opening 32C includes a GaAs low temperature buffer layer 41 having a thickness of 500 nm provided on the surface of the Si substrate 11. The column-like multi-layer structure 40 further includes a GaAs underlying layer 42 having a thickness of 1 μm, an n-AlGaAs clad layer 43 having a thickness of 200 nm, an AlGaAs active layer 44, a p-AlGaAs clad layer 45, and a p-GaAs contact layer 46. The layers 42, 43, 44, 45 and 46 are stacked on the buffer layer 41 in this order.

The column-like multi-layer structures 20 and 40 are buried in the insulating layer 31. A top surface of the insulating layer 31 is substantially entirely covered with a transparent electrode 16, such that a top surface of each of the column-like multi-layer structures 20 and 40, i.e., the second clad layer 25 of all the column-like multi-layer structures 20 and the contact layer 46 of all the column-like multi-layer structures 40 contact the transparent electrode 16. In this manner, all the column-like multi-layer structures 20 and 40 are electrically connected to each other.

On a corner of the transparent electrode 16, a cylindrical bonding electrode 17 is provided for externally supplying electric current to the transparent electrode 16. On a bottom surface of the Si substrate 11, a rear electrode 19 is provided.

The nitride semiconductor light emitting device 200 having the above-described structure is produced in the following manner.

Figure 9:
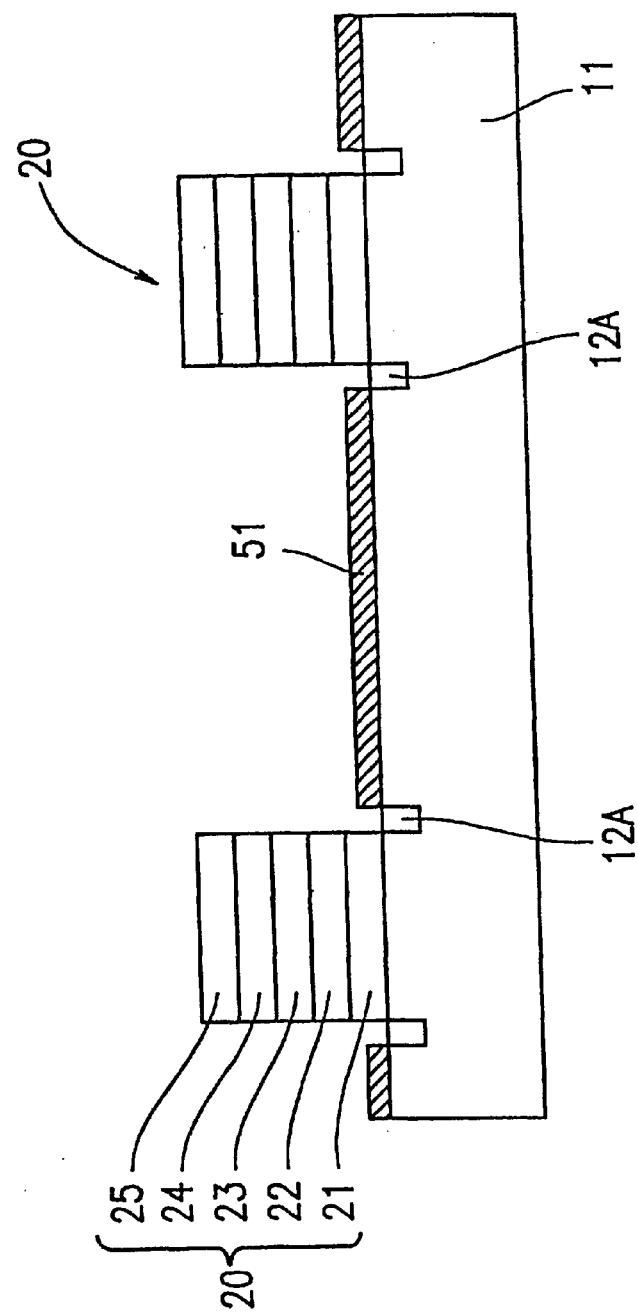
FIG. 9 is a schematic cross-sectional view of a laminate obtained during the production of the semiconductor light emitting device shown in FIG. 7.

FIG. 9 is a schematic cross-sectional view of the Si substrate 11 having the grooves 12A and the column-like multi-layer structures 20. The grooves 12A and the column-like multi-layer structures 20 are formed as follows.

First, a mask layer 51 is formed on the entire surface of the Si substrate 11 to a thickness of 100 nm. The mask layer 51 is formed of an oxide material such as $SiO_2$ or the like or a nitride material such as SiN or the like. The thickness of the mask layer 51 is preferably 50 nm or more. When the thickness of the mask layer 51 is less than 50 nm, the mask layer 51 is easily delaminated, and ammonia gas used for growing the column-like multi-layer structures 20 easily permeates into the mask layer 51 and thus tends to nitride the surface of the Si substrate 11. These phenomena have adverse effects on the later production steps. After the formation of the mask layer 51, portions of the mask layer 51 having a width of 5 μm are removed by photolithography and etching. Then, the Si substrate 11 is etched with a mixed acid containing HF, $HNO_3$ and acetic acid. Thus, the grooves 12A are formed in the Si substrate 11. Then, portions of the mask layer 51 on areas of the Si substrate 11, on which the column-like multi-layer structures 20 are to be formed, are removed. The column-like multi-layer structures 20 are grown on the areas by the method described in the first example.

Figure 10:
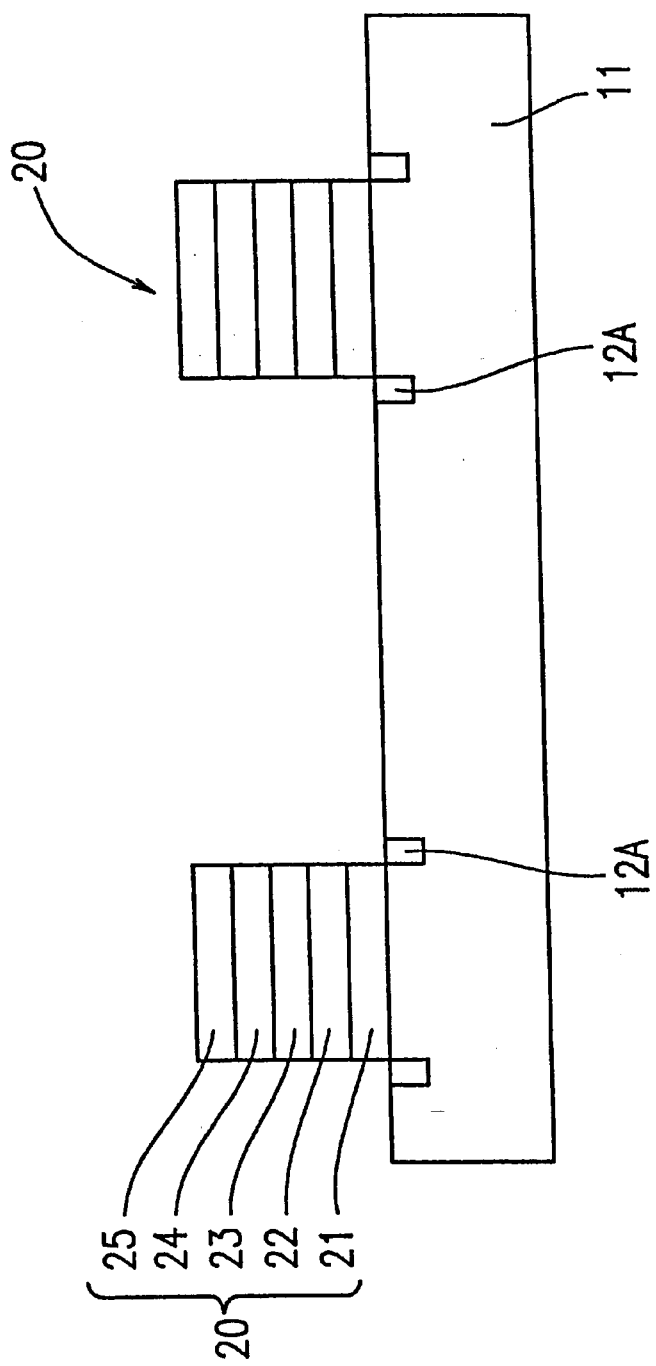
FIG. 10 is a schematic cross-sectional view of another laminate obtained during the production of the semiconductor light emitting device shown in FIG. 7.

Then, as shown in FIG. 10, the remaining portions of the mask layer 51 on areas (only one is shown in FIG. 10) of the Si substrate 11, on which the column-like multi-layer structures 40 are to be formed, are removed. The column-like multi-layer structures 20 are protected by an oxide layer, and then the column-like multi-layer structures 40 are grown. The column-like multi-layer structures 40 are based on GaAs and emit light having a long wavelength.

Then, the oxide layer provided for protecting the column-like multi-layer structures 20 is removed. The insulating layer 31 is formed so as to cover side surfaces of the column-like multi-layer structures 20 and 40 and parts of surfaces of the column-like multi-layer structures 20 and 40. As shown in FIG. 7, the column-like multi-layer structures 20 are each provided in the opening 32B, and the column-like multi-layer structures 40 are each provided in the opening 32C. The insulating layer 31 is formed such that the column-like multi-layer structures 20 and 40 are not short-circuited when the transparent electrode 16 is provided in a later production step.

On an entire surface of the insulating layer 31, the transparent electrode 16 is formed so as to cover the second clad layer 25 (p-type $Ga_{0.9}In_{0.1}N$) of all the column-like multi-layer structures 20 and the p-GaAs contact layer 46 of all the column-like multi-layer structures 40. By this step, the column-like multi-layer structures 20 and 40, which are insulated from each other by the insulating layer 31, are electrically connected to each other by the transparent electrode 16.

Then, the bonding electrode 17 is formed on a corner of the transparent electrode 16, or on an area of the transparent electrode 16 corresponding to no column-like multi-layer structure 20 or 40. The rear electrode 19 is formed on a bottom surface of the Si substrate 11. Thus, the nitride semiconductor light emitting device 200 shown in FIGS. 7 and 8 is produced.

The transparent electrode 16, the bonding electrode 17 and the rear electrode 19 may be provided for each of the column-like multi-layer structure 20 and 40.

EXAMPLE 3

Figure 11:
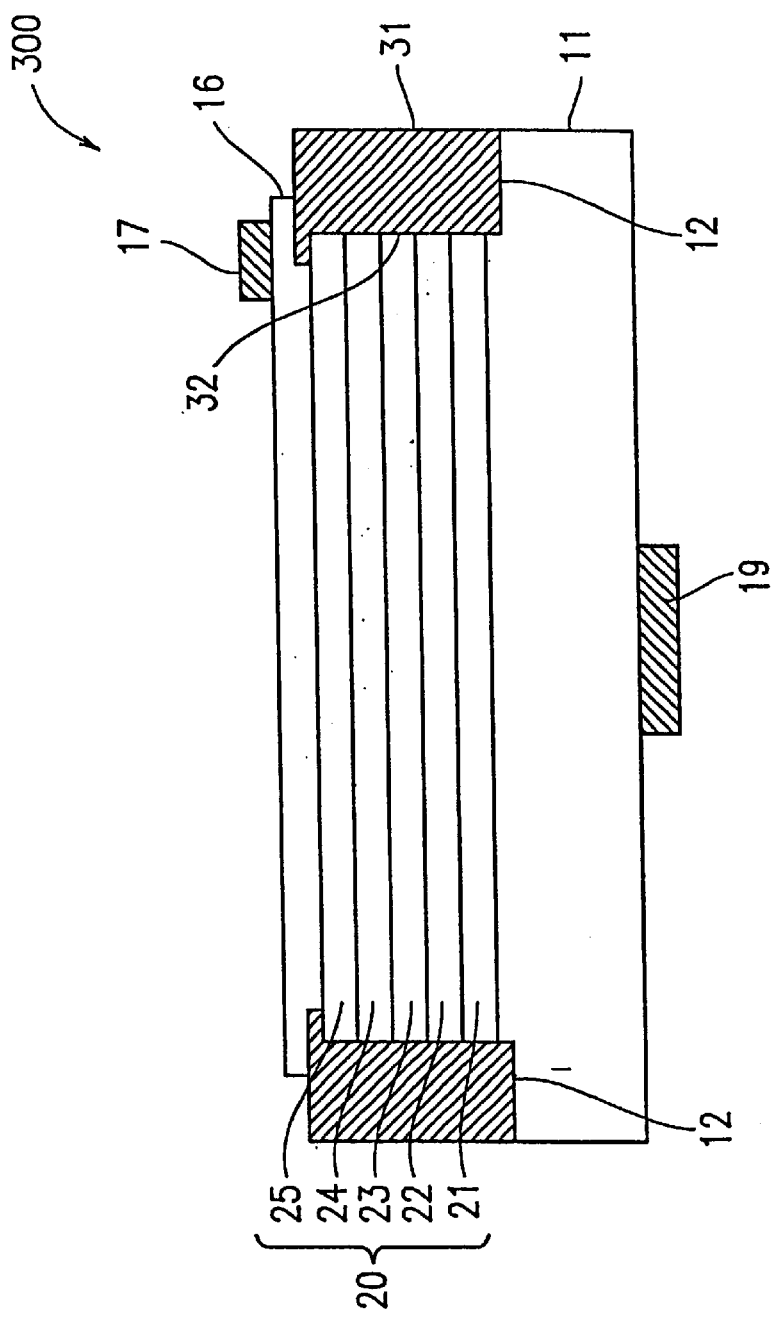
FIG. 11 is a schematic cross-sectional view of a semiconductor light emitting device according to a third example of the present invention.

FIG. 11 is a schematic cross-sectional view of a nitride semiconductor light emitting device 300 according to a third example of the present invention. Identical elements previously discussed with respect to FIGS. 1 through 6 in the first example bear identical reference numerals and the detailed descriptions thereof will be omitted.

In the nitride semiconductor light emitting device 300, the width of the openings 32 in the insulating layer 31 is larger than that in the first example. Even in the case where each chip of the nitride semiconductor light emitting device 300 includes one column-like multi-layer structure 20, a desirable semiconductor light emitting device results.

The nitride semiconductor light emitting device 300 includes an Si substrate 11 having a (111) plane and an insulating layer 31 provided on the Si substrate 11. The insulating layer 31 has an opening 32, in which the column-like multi-layer structure 20 is to be grown. The insulating layer 31 contains, for example, $SiO_2$.

The insulating layer 31 is precisely provided on a bottom surface of a plurality of grooves 12 formed in a surface of the Si substrate 11. The grooves 12 are provided so as to surround the opening 32. The opening 32 passes through the insulating layer 31 so as to expose the surface of the Si substrate 11.

The column-like multi-layer structure 20 provided in the opening 32 includes a buffer layer 21 provided on the surface of the Si substrate 11. The buffer layer 21 contains Si-doped n-AlInN. The column-like multi-layer structure 20 further includes a first clad layer 22 containing n-GaInN, a light emitting layer 23 containing $In_xGa_{1-x}N$, a carrier block layer 24 containing p-AlGaInN, and a second clad layer 25 containing p-GaInN. The layers 22, 23, 24 and 25 are stacked on the buffer layer 21 in this order.

The column-like multi-layer structure 20 is buried in the insulating layer 31. Atop surface of the insulating layer 31 is substantially entirely covered with a transparent electrode 16, so that a top surface of the column-like multi-layer structure 20, i.e., the second clad layer 25 of the column-like multi-layer structure 20 contacts the transparent electrode 16.

On a corner of the transparent electrode 16, a cylindrical bonding electrode 17 is provided for externally supplying electric current to the transparent electrode 16. On a bottom surface of the Si substrate 11, a rear electrode 19 is provided.

The nitride semiconductor light emitting device 300 having the above-described structure is produced in the following manner.

Figure 12:
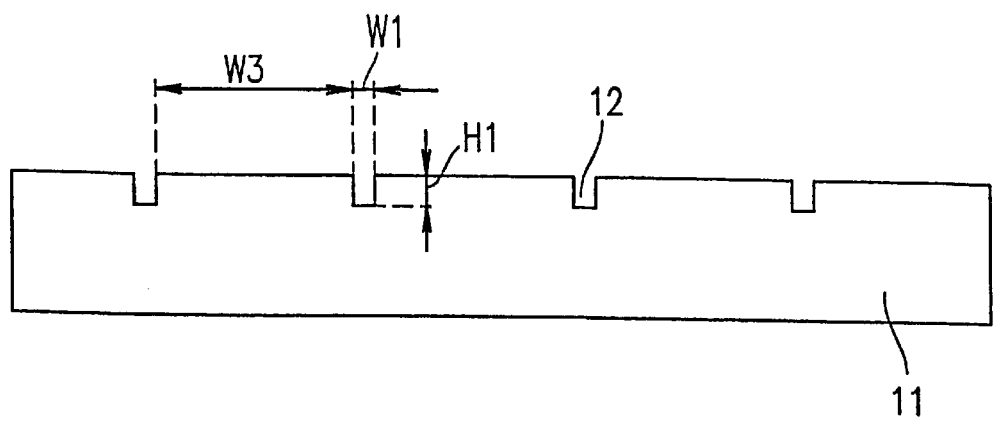
FIG. 12 is a schematic cross-sectional view of a laminate obtained during the production of the semiconductor light emitting device shown in FIG. 11.
Figure 13:
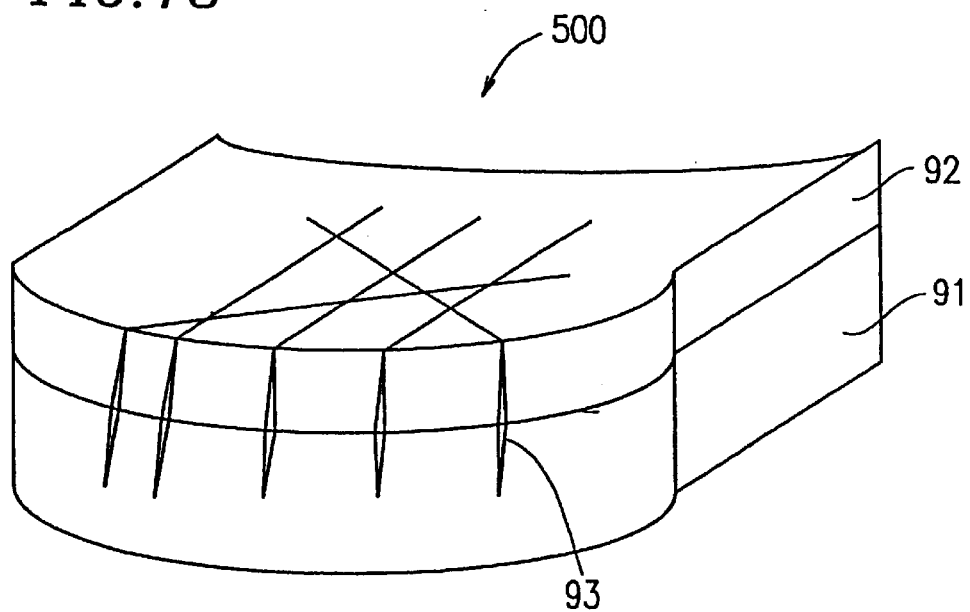
FIG. 13 is a schematic isometric view of a conventional semiconductor light emitting device.
Figure 14:
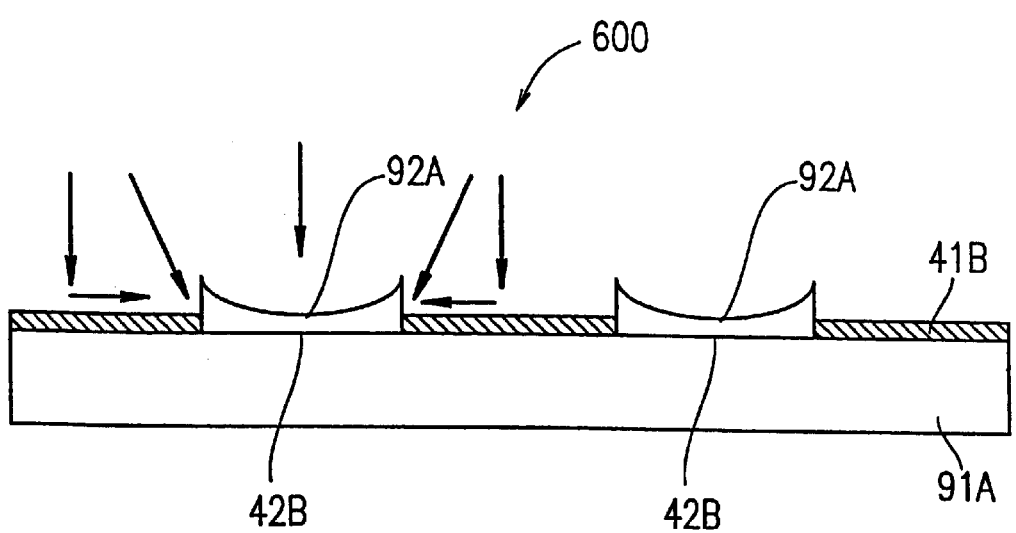
FIG. 14 is a schematic cross-sectional view of another conventional semiconductor light emitting device.

FIG. 12 is a schematic cross-sectional view of the Si substrate 11 having the grooves 12. After the Si substrate 11 is washed, the grooves 12 are formed in a prescribed lattice pattern so as not to interfere positions corresponding to a plurality of openings 32 in each of which the column-like multi-layer structure 20 is to be grown. The grooves 12 each have a width W1 of about 5 μm and a depth H1 of about 5 μm. Each opening 32 has a width W3 of about 200 μm, which is larger than in the first example. The width W3 is preferably in the range of 200 μm to 400 μm.

After the grooves 12 are formed in the Si substrate 11 as described above, the surface of the Si substrate 11 is washed.

Then, the Si substrate 11 having the grooves 12 is put into an MOCVD apparatus. The Si substrate 11 is washed at a temperature of as high as 1100° C. in a hydrogen ($H_2$) atmosphere.

While supplying $N_2$ as a carrier gas at a flow rate of 10 L/min. to the MOCVD apparatus, $NH_3$, trimethyl aluminum (TMA) and trimethyl indium (TMI) are supplied at 800° C., at respective flow rates of 5 L/min., 20 μmol/min., and 137 μmol/min. Several seconds later, $SiH_4$ gas is introduced to the MOCVD apparatus, thereby performing Si doping. Thus, the buffer layer 21 of $Al_{0.85}In_{0.15}N$ is grown to a thickness of about 30 nm in each of positions corresponding to the openings 32.

In the above-described crystal growth of MOVPE, organic metals (TMA and TMI) as a group III gas are supplied several seconds before $NH_3$ gas of group V. This flattens the buffer layer 21, for the following possible reason. In the case where $NH_3$ gas is supplied before the organic metals, the surface of the Si substrate 11 is nitrided. By contrast, when the organic metals are supplied before $NH_3$ gas, the surface of the Si substrate 11 is prevented from being nitrided, and a group III element is provided on the surface of the Si substrate 11. The precise timing for supplying the organic metals before the $NH_3$ gas varies depending on the specifications of the MOCVD apparatus.

Before providing the buffer layer 21, it is preferable to provide a layer of $Al_{0.95}In_{0.05}N$, which has a higher Al ratio than the buffer layer 21 on the Si substrate 11, to a thickness of 20 nm. With such a structure, the state of the interface between the Si substrate 11 and the column-like multi-layer structure 20 is improved.

After the buffer layer 21 is formed, the supply of TMA is stopped. TMG is introduced at a flow rate of about 20 μmol/min., and TMI is introduced at a flow rate of about 100 μmol/min., still at 800° C., thereby crystal-growing Si-doped $Ga_{0.92}In_{0.08}N$ so as to form the first clad layer 22 of n-type having a thickness of about 300 nm.

The first clad layer 22 may be formed of GaN, which is obtained by increasing the temperature after the buffer layer 21 is formed. The first clad layer 22 may also be formed of GaInN, which includes In and excludes Al. The GaInN layer can be grown at a lower temperature, which contributes to the suppression of crack generation in the Si substrate 11.

After the first clad layer 22 is formed, the supply of TMA, TMI, and TMG is stopped, and the substrate temperature is lowered to 760° C. Then, TMI and TMG are supplied at respective flow rates of 6.5 μmol/min. and 2.8 μmol./min, thereby growing a well layer containing $In_{0.18}Ga_{0.82}N$ to a thickness of 3 nm. Then, the temperature is raised to 850° C., and TMG is supplied at a flow rate of 14 μmol/min., thereby growing a barrier layer containing GaN. The growth of the well layer and the barrier layer is repeated in this manner, thereby forming a multiple quantum well (MQW) layer including five well layers and five barrier layers provided alternately. The multiple quantum well (MQW) layer acts as the light emitting layer 23.

After the light emitting layer 23 is formed, TMG, TMA, and TMI are supplied at respective flow rates of 11 μmol/min., 1.1 μmol/min. and 40 μmol/min. at substantially the same temperature as used for growing the uppermost barrier layer. Concurrently, biscyclopentadienyl magnesium ($Cp_2Mg$), which is a p-type doping gas, is supplied at a flow rate of 10 nmol/min. Thus, the carrier block layer 24 of p-type containing Mg-doped $Al_{0.20}Ga_{0.75}In_{0.05}N$ is grown to a thickness of 50 nm.

After the carrier block layer 24 is formed, the supply of TMA is stopped. Thus, Mg-doped GaN is crystal-grown at substantially the same temperature, thereby forming the second clad layer 25 of p-type $Ga_{0.9}In_{0.1}N$ to a thickness of 100 nm.

In this manner, the column-like multi-layer structure 20 is formed on the Si substrate 11. Then, the supply of TMG, TMI and $Cp_2Mg$ is stopped and the temperature is lowered to room temperature. Then, the resultant laminate is removed from the MOCVD apparatus.

The transparent electrode 16 is formed so as to cover the second clad layer 25 of the column-like multi-layer structure 20 in each of the plurality of openings 32. Then, a bonding electrode 17 is formed on each transparent electrode 16. A rear electrodes 19 is formed on a bottom surface of the Si substrate 11 in positional correspondence with each transparent electrode 16. The resultant laminate is divided into a plurality of chips, each including one column-like multi-layer structure 20. Thus, the nitride semiconductor light emitting device 300 shown in FIG. 11 is produced.

The nitride semiconductor light emitting device 300 appears the same as a nitride semiconductor light emitting device produced without forming any groove in the Si substrate. However, formation of the grooves 12 in the Si substrate 11 during the production of the nitride semiconductor light emitting device 300 alleviates the edge growth, which is caused while the column-like multi-layer structure 20 is formed. Such alleviation of the edge growth is indispensable to avoid the generation of cracks.

In all of the above-described examples, the column-like multi-layer structure 20 may have a thermal expansion coefficient which is larger than that of the Si substrate 11.

According to the present invention, the grooves are formed in the Si substrate in order to separate the plurality of column-like multi-layer structures from each other. The formation of the grooves prevents edge growth, i.e., local increase in the thickness of the layers of the column-like multi-layer structure. As a result, each of the layers of the column-like multi-layer structure is flat, which suppresses the generation of cracks.

As a result, a nitride semiconductor light emitting device having a long life and high luminance emission despite the use of an Si substrate is realized.

The present invention provides a method for producing a semiconductor light emitting device using an Si substrate and still preventing cracks from being generated at an interface between the Si substrate and a nitride semiconductor layer; and a semiconductor light emitting device produced by such a method.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A method for producing a semiconductor light emitting device including at least one first column-like multi-layer structure provided on a substrate and containing nitride-based semiconductor compound semiconductor layers represented by the general formula $In_xGa_yAl_zN$ (where $x+y+z=1$, $0 \leq x \leq 1$, $0 \leq y \leq 1$, $0 \leq z \leq 1$), the method comprising:

a first step of forming a plurality of grooves in the substrate; and a second step of forming a plurality of first column-like multi-layer structures on the substrate so as to be separated by the grooves.

2. A method according to claim 1, further comprising:

a third step of, after the second step, removing a substance including epitaxial layers deposited in the grooves; and a fourth step of, after the third step, forming an insulating layer in the grooves for electrically separating the plurality of first column-like multi-layer structures from each other.

3. A method according to claim 2, further comprising the step of, after the fourth step, forming a transparent electrode for electrically connecting the plurality of first column-like multi-layer structures to each other.

4. A method according to claim 2, further comprising the steps of, after the fourth step, forming a transparent electrode for each of the plurality of first connecting the column-like multi-layer structures; and dividing the resultant laminate into a plurality of chips such that each chip includes one first column-like multi-layer structure.

5. A method according to claim 1, wherein:

the grooves are arranged in a lattice pattern, the substrate includes a plurality of first areas and a plurality of second areas, each of which is surrounded by the grooves, the plurality of first areas and the plurality of second areas are arranged in a chess board pattern, and the method further comprises the steps of, before the first step, forming a mask layer so as to cover the substrate, and removing a portion of the mask layer corresponding to the grooves which are to be formed in the substrate, and the second step includes the steps of:

removing portions of the mask layer which are on the plurality of first areas and forming one first column-like multi-layer structure on each of the plurality of first areas, and removing portions of the mask layer which are on the plurality of second areas and forming a second column-like multi-layer structure on each of the plurality of second areas.

6. A method according to claim 1, wherein the plurality of first column-like multi-layer structures each have a thermal expansion coefficient which is larger than a thermal expansion coefficient of the substrate.

7. A method according to claim 1, wherein the substrate is formed of silicon.

8. A method according to claim 1, wherein:

the grooves each have a depth which is at least 50% of a thickness of each of the plurality of first column-like multi-layer structures in a directions vertical to a surface of the substrate, and is 10 $\mu$m or less, and the grooves each have a width which is 2 $\mu$m or more and 10 $\mu$m or less.

9. A method according to claim 1, wherein the grooves cross each other.

10. A semiconductor light emitting device including at least one first column-like multi-layer structure provided on a substrate and containing nitride-based semiconductor compound semiconductor layers represented by the general formula $In_xGa_yAl_zN$ (where $x+y+z=1$, $0 \leq x \leq 1$, $0 \leq y \leq 1$, $0 \leq z1$), the semiconductor light emitting device produced by a method according to claim 1.

11. A semiconductor light emitting device including at least one first column-like multi-layer structure provided on a substrate and containing nitride-based semiconductor compound semiconductor layers represented by the general formula InxGayAlzN (where x+y+x=1, $0 \leq x \leq 1$, $0 \leq y \leq 1$, $0 \leq z1$), wherein the substrate comprises a plurality of grooves, and a plurality of first column-like multi-layer structures are formed on the substrate so as to be separated by the grooves.

12. A device according to claim 11, further comprising;

an insulating layer formed in the grooves for electrically separating the plurality of first column-like multi-layer structures from each other.

13. A device according to claim 12, further comprising a transparent electrode for electrically connecting the plurality of first column-like multi-layer structures to each other.

14. A device according to claim 12, further comprising a transparent electrode for connecting each of the plurality of first column-like multi-layer structures; and wherein the resultant laminate is divided into a plurality of chips such that each chip includes one first column-like multi-layer structure.

15. A device according to claim 11, wherein the grooves are arranged in a lattice pattern, the substrate includes a plurality of first areas and a plurality of second areas, each of which is surrounded by the grooves, the plurality of first areas and the plurality of second areas are arranged in a chess board pattern.

16. A device according to claim 11, wherein the plurality of first column-like multi-layer structures each have a thermal expansion coefficient which is larger than a thermal expansion coefficient of the substrate.

17. A device according to claim 11, wherein the substrate is formed of silicon.

18. A device according to claim 11, wherein:

the grooves each have a depth which is at least 50% of a thickness of each of the plurality of first column-like multi-layer structures in a direction vertical to a surface of the substrate, and is 10 $\mu$m or less, and the grooves each have a width which is 2 $\mu$m or more and 10 $\mu$m or less.

19. A device according to claim 11, wherein the grooves cross each other.

* * * * *